United States Patent
Kouvetakis et al.

(10) Patent No.: US 7,582,891 B2
(45) Date of Patent: Sep. 1, 2009

(54) MATERIALS AND OPTICAL DEVICES BASED ON GROUP IV QUANTUM WELLS GROWN ON SI-GE-SN BUFFERED SILICON

(75) Inventors: John Kouvetakis, Mesa, AZ (US); Jose Menendez, Tempe, AZ (US); John Tolle, Gilbert, AZ (US); Ling Liao, Santa Clara, CA (US); Dean Samara-Rubio, San Jose, CA (US)

(73) Assignee: Arizona Board of Regents, A Corporate Body Organized Under Arizona Law, Acting on Behalf of Arizona State University

( * ) Notice: Subject to any disclaimer, the term of this patent is extended or adjusted under 35 U.S.C. 154(b) by 0 days.

(21) Appl. No.: 11/663,024

(22) PCT Filed: Sep. 16, 2005

(86) PCT No.: PCT/US2005/033148

§ 371 (c)(1),
(2), (4) Date: Dec. 3, 2007

(87) PCT Pub. No.: WO2006/034025

PCT Pub. Date: Mar. 30, 2006

(65) Prior Publication Data

US 2008/0277647 A1 Nov. 13, 2008

Related U.S. Application Data

(60) Provisional application No. 60/611,036, filed on Sep. 16, 2004.

(51) Int. Cl.
*H01L 29/739* (2006.01)
(52) U.S. Cl. .......................... 257/14; 257/18; 257/19; 257/9; 257/E33.016
(58) Field of Classification Search .................... 257/9, 257/14, 19, 12
See application file for complete search history.

(56) References Cited

U.S. PATENT DOCUMENTS

| | | | |
|---|---|---|---|
| 5,548,128 A * | 8/1996 | Soref et al. | 257/18 |
| 6,441,716 B1 | 8/2002 | Doppalapudi et al. | |
| 6,897,471 B1 | 5/2005 | Soref et al. | |
| 6,911,084 B2 | 6/2005 | Kouvetakis et al. | |
| 7,238,596 B2 | 7/2007 | Kouvetakis et al. | |
| 7,374,738 B2 | 5/2008 | Kouvetakis et al. | |
| 2006/0163612 A1 * | 7/2006 | Kouvetakis et al. | 257/201 |
| 2006/0236923 A1 | 10/2006 | Kouvetakis et al. | |
| 2007/0020891 A1 | 1/2007 | Kouvetakis et al. | |
| 2008/0187768 A1 | 8/2008 | Kouvetakis et al. | |

* cited by examiner

*Primary Examiner*—Victor Mandala
*Assistant Examiner*—William Harriston
(74) *Attorney, Agent, or Firm*—McDonnell Boehnen Hulbert & Berghoff LLP

(57) ABSTRACT

Semiconductor structures having at least one quantum well heterostructure grown strain-free on Si(100) via a $Sn_{1-x}Ge_x$ buffer layer and their uses are provided.

5 Claims, 13 Drawing Sheets

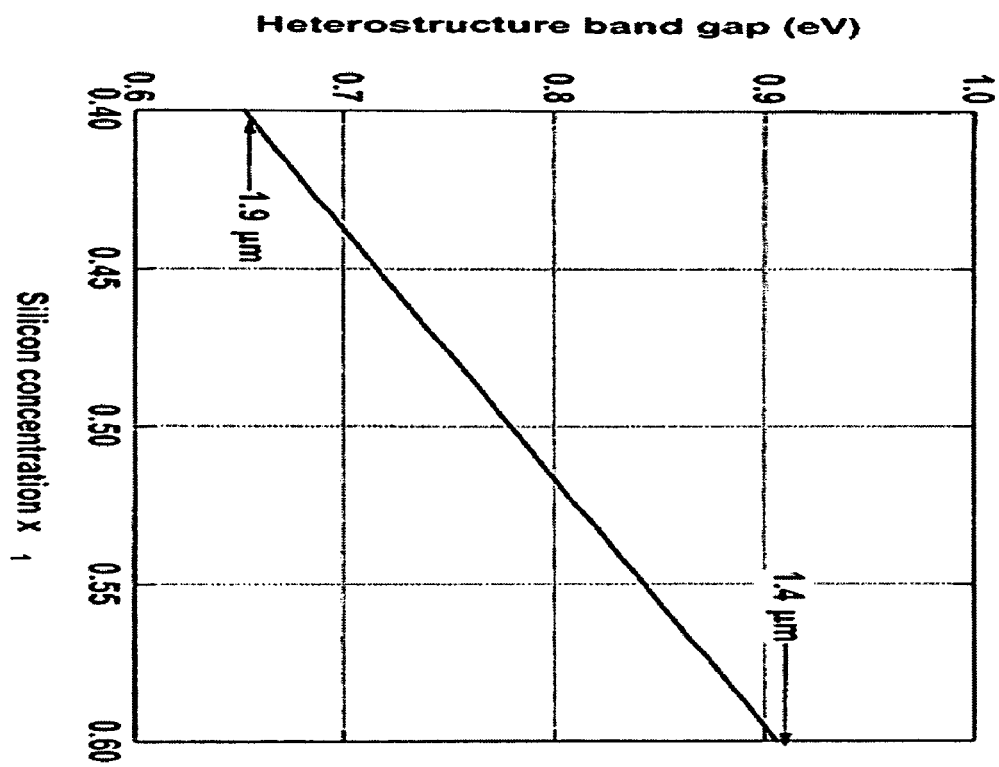
Figure 5
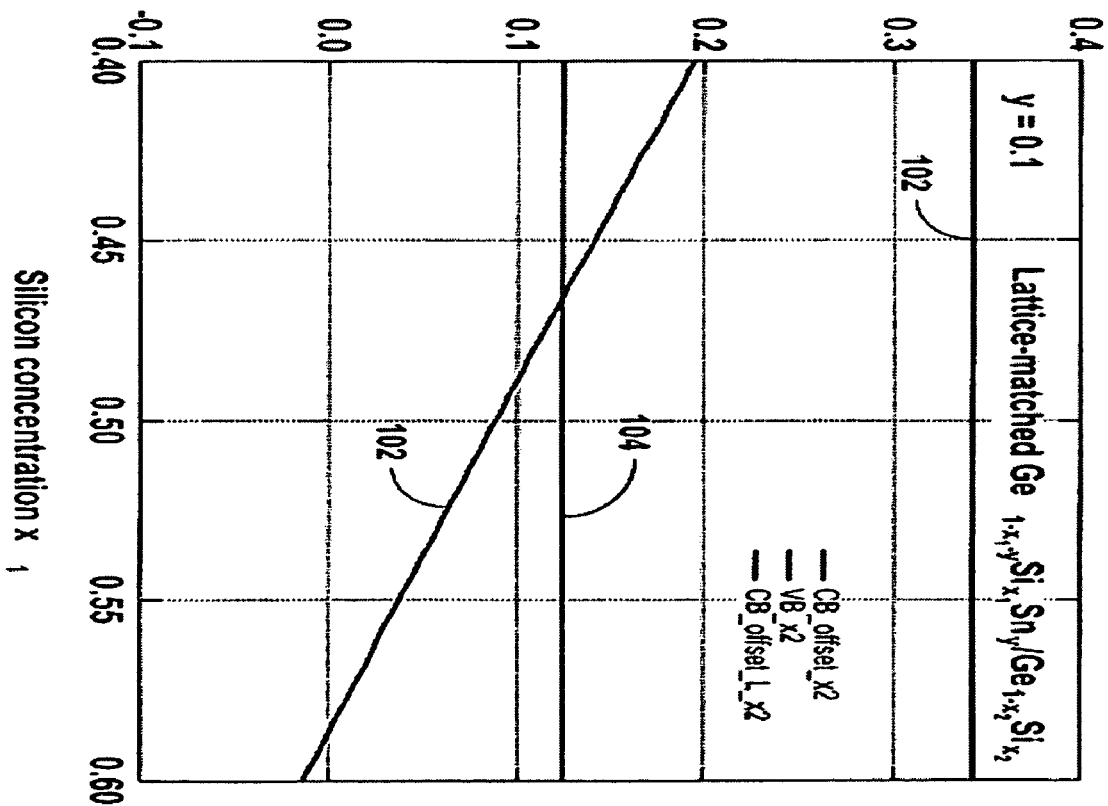

Figure 6
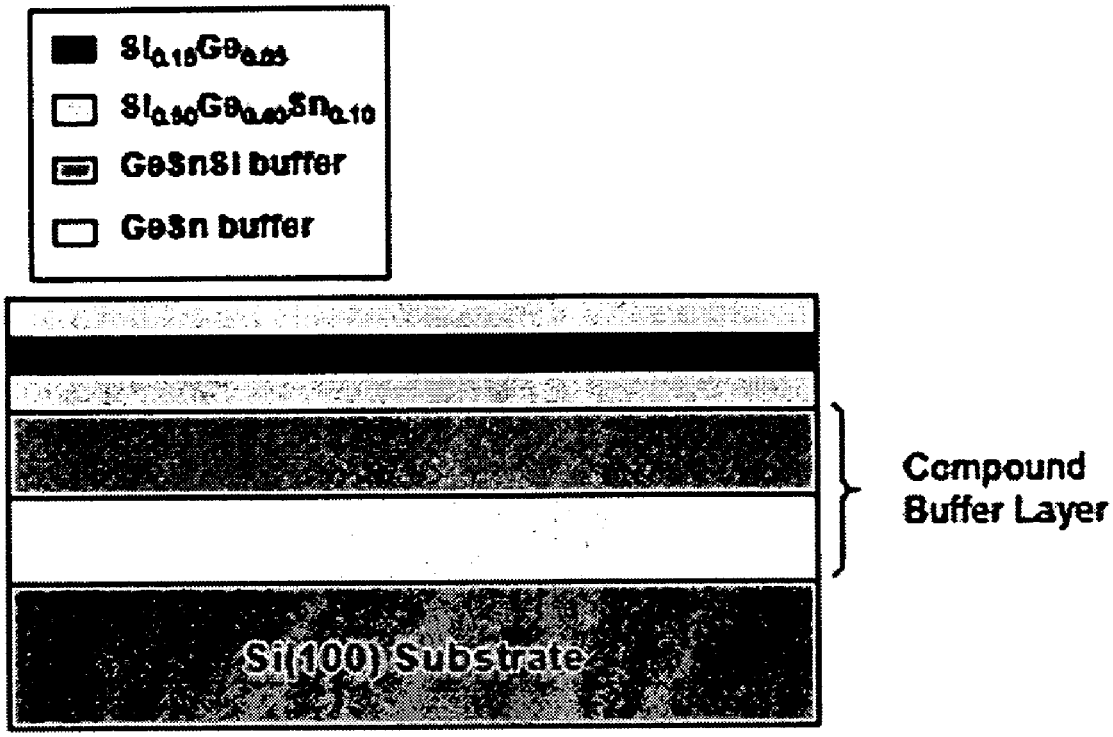
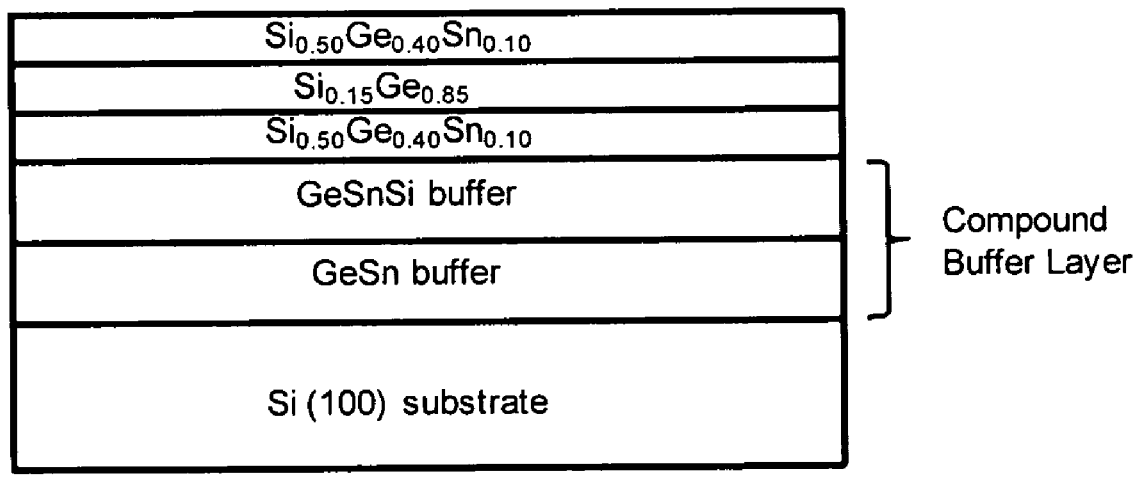
Figure 7

MATERIALS AND OPTICAL DEVICES BASED ON GROUP IV QUANTUM WELLS GROWN ON SI-GE-SN BUFFERED SILICON

STATEMENT OF GOVERNMENT INTEREST

This work was supported in part by National Science Foundation grant numbers DMR0221993 and ENG0304362, and Air Force grant number ESC: F19628-03-C-0056. Thus the U.S. government may have certain rights in the invention.

BACKGROUND

It has been known for some time, at least on theoretical grounds, that high quality Si—Ge—Sn alloy systems will possess very interesting material properties, especially when implemented in infrared (IR) devices (such as detectors, sensors or modulators). This knowledge has prompted extensive experimental efforts to develop techniques to manufacture (e.g., grow) such alloy compounds. However, historically, the resulting quality of such alloy materials has not been sufficiently high (e.g., due to lattice mismatch between materials, among other factors) so as to allow for effective use of such alloys in device applications (e.g., in infrared devices). Therefore, alternative methods for manufacturing such Si—Ge—Sn alloy systems are desirable.

The foregoing discussion of the related art and limitations related therewith is intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are given by way of example and meant to be illustrative, not limiting in scope. In various embodiments, one or more of the above-described problems have been reduced or eliminated, while other embodiments are directed to other improvements.

High quality Sn—Ge and Si—Ge—Sn alloys (alloy systems) and methods for manufacturing such alloys are disclosed. Such alloys are of sufficient quality so as to allow for their use in device applications. The manufacture of such alloys is achieved through chemical vapor deposition (CVD) techniques that have been developed for forming such materials, and are also disclosed herein.

The ability to form (manufacture) such device quality alloys has significant industry value for a number of reasons. For example, $Sn_xGe_{1-x}$ alloys have been predicted to undergo a transition from indirect-to direct-gap semiconductors. Therefore, the availability of such alloy materials may ultimately allow for a direct-gap semiconductor to be fully integrated with Si technology.[1,2]

Further, such device-quality $Sn_xGe_{1-x}$ layers of arbitrary thickness may be deposited directly on Si and these alloy layers may be used as "virtual substrates" or "buffer layers" for the growth of $Ge_{1-x-y}Si_xSn_y$ ternary analogs.[3] The fabrication of $Ge_{1-x-y}Si_xSn_y$ makes it possible (using such a buffer alloy layer) to decouple strain and band gap engineering to achieve unique device structures that allow for the production of photonic devices based entirely on group IV materials. Such applications may cover a wide range of operating wavelengths in the IR range and include strain-engineered direct gap heterodiodes and multi-quantum well lasers; photodetectors; emitters and modulators grown on $Sn_{1-x}Ge_x$ and $Ge_{1-x-y}Si_xSn_y$ buffered Si.[4]

In an example embodiment, alloy systems that are specifically designed to display quantum confinement Stark effects (QCSE) are implemented. These materials can be used to fabricate new modulator devices, such as are disclosed herein.

Materials that display such QCSE are disclosed herein. These materials include Si—Ge—Sn semiconductors that are manufactured using the methods that are disclosed herein. These materials may be used to fabricate optical devices that utilize indirect transitions to obtain modulation of the absorption and index of refraction at IR wavelengths of technological interest.

In order to evaluate the potential application of alloy materials that are disclosed herein, experiments on growth characterization, properties measurement and performance evaluation of materials which include single quantum well (SQW) $Ge_{1-x1-y}Si_{x1}Sn_y/Ge_{1-x2}Si_{x2}$ heterostructures grown fully strained or strain-free on Si(100) via $Sn_{1-x}Ge_x$ buffer layers may be performed. The alloy materials included in these structures may be deposited using CVD techniques that include the use of specially designed molecular precursors. Such materials also will display strong QCSE (e.g., a shift in exciton absorption peaks in a quantum well structure when an electric field is applied). Such SQWs may then be utilized as building blocks to fabricate multi quantum well (MQW) modulator structures with band gaps covering the 1.4-1.9 μm range, which is of value to industry.

An example free space modulator structure operating in transmission at 1.55 μm that predominately relies on electro-absorption (EA) is disclosed herein. Further, a reflective version of such an EA modulator is also described. For the reflective EA modulator, in addition to the conventional multi-layer dielectric stack mirror, the structure is fabricated, in part, by forming a reflective modulator device based on the above described MQWs and a single layer of conductive and fully reflective $ZrB_2$.

Waveguide structures that may be used as the basis of optical modulators operating via electro-refraction are also described. Such waveguide structures may be formed using the same MQW systems discussed above. Waveguide-based electro-absorption modulator devices are also discussed herein.

The devices described herein take advantage of expertise that has been gained in the area of materials growth, as is disclosed herein. This expertise includes processing techniques and determination of the material property of Sn lowering the direct gap in certain materials so as to allow for the design and fabrication of devices that utilize absorptions based on direct transitions in single-quantum wells (e.g., positive-intrinsic-negative (PIN) photodetectors) that may operate between 1.55 μm and 5.00 μm.

Using the techniques disclosed herein, a semiconductor structure including a single quantum well $Ge_{1-x1-y}Si_{x1}Sn_y/Ge_{1-x2}Si_{x2}$ heterostructure grown strain-free on Si(100) with a $Sn_{1-x}Ge_x$ buffer layer may be achieved.

BRIEF DESCRIPTION OF THE DRAWINGS

Example embodiments are illustrated in referenced figures of the drawings. It is intended that the embodiments and figures disclosed herein are to be considered illustrative rather than restrictive.

Figure 2:
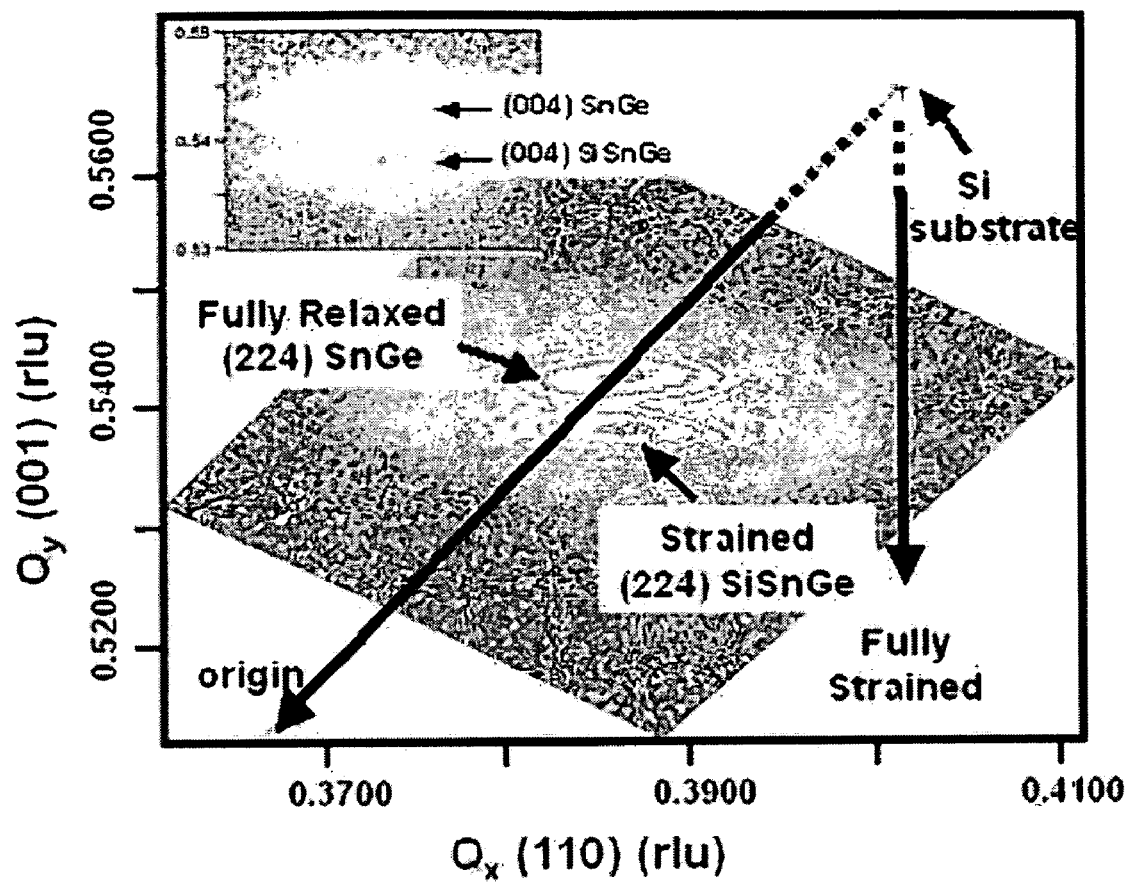
Figure 3:
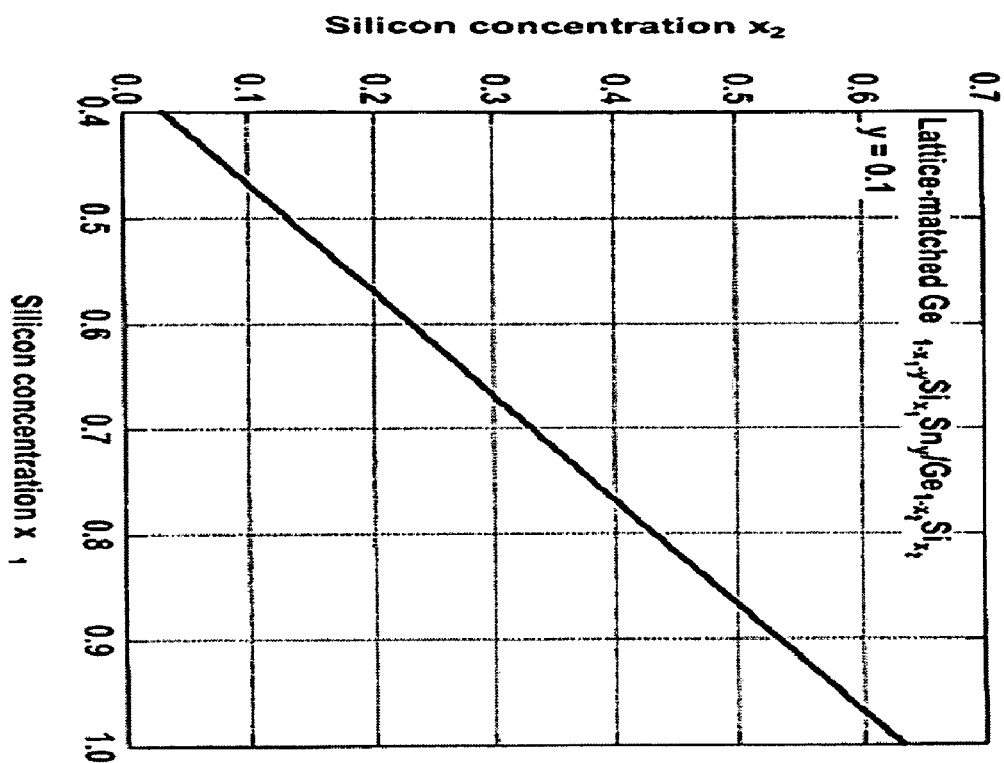
Figure 4:
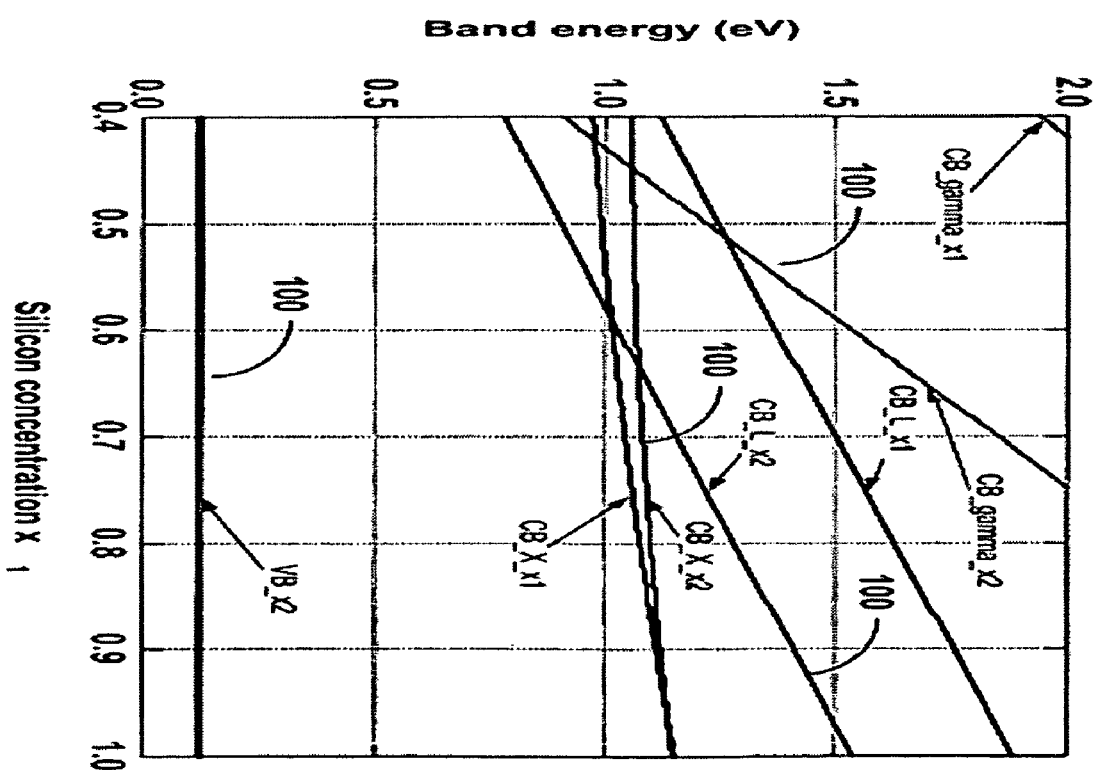
Figure 8:
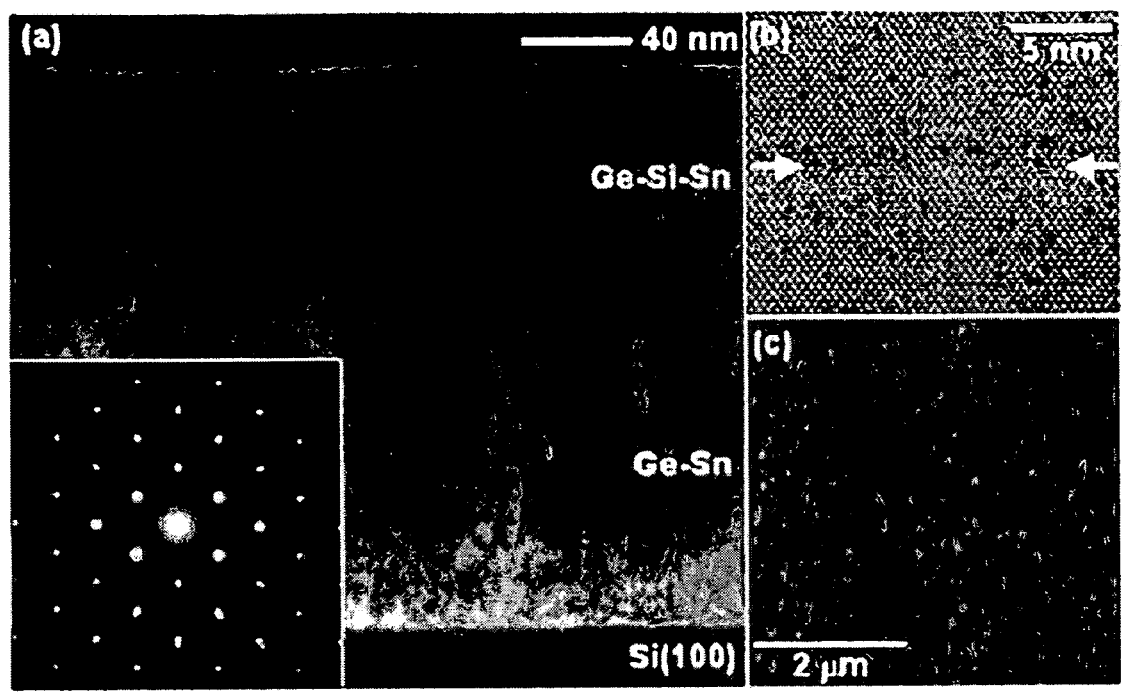
Figure 9:
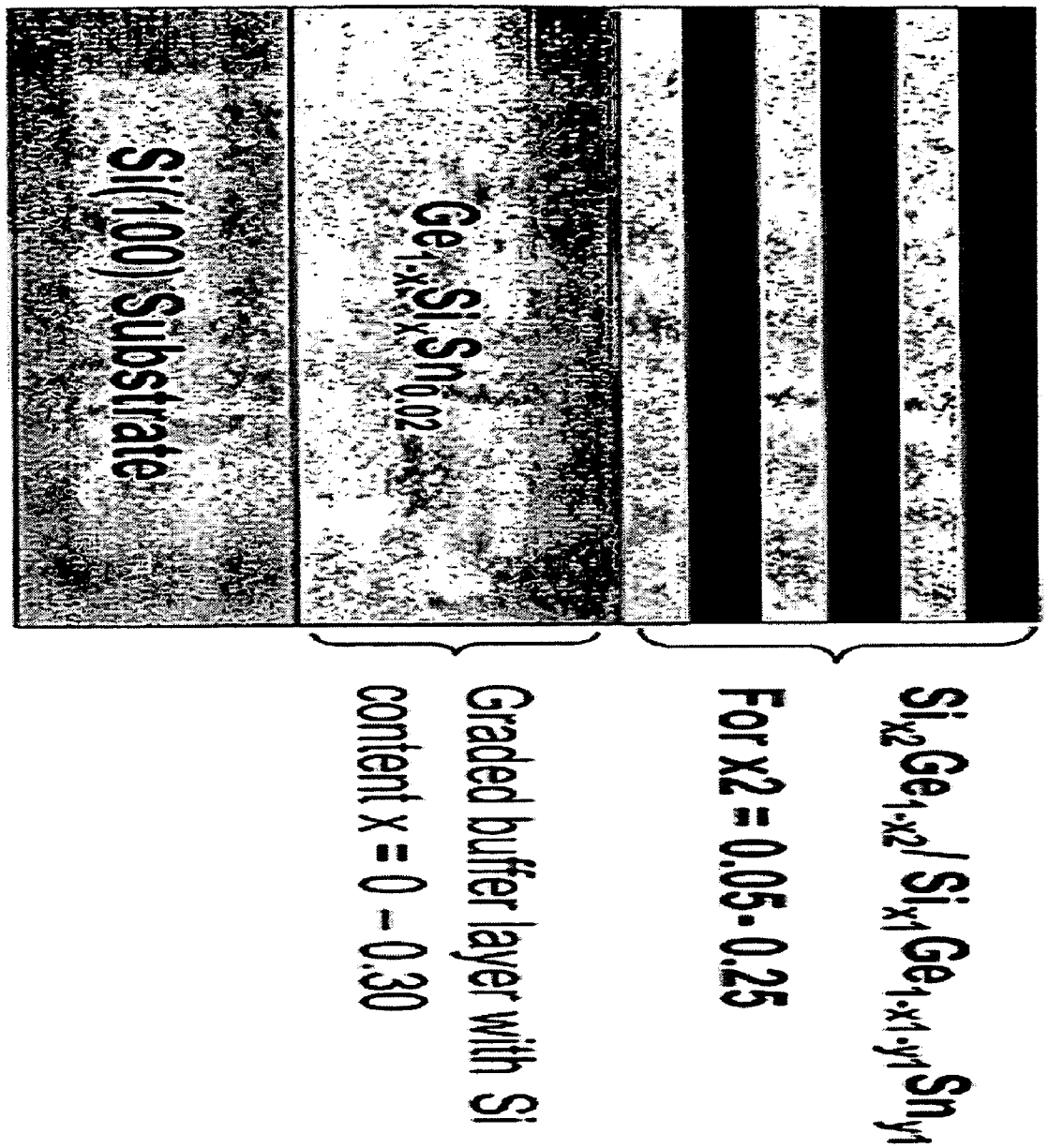
Figure 10:
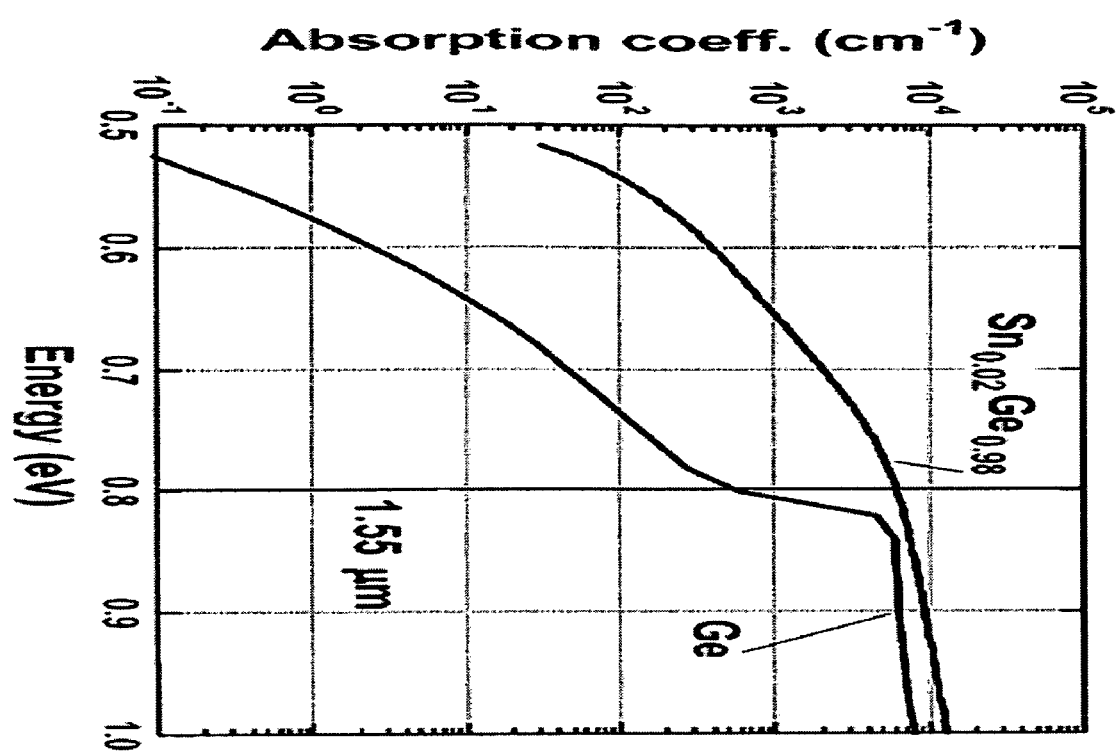
Figure 11:
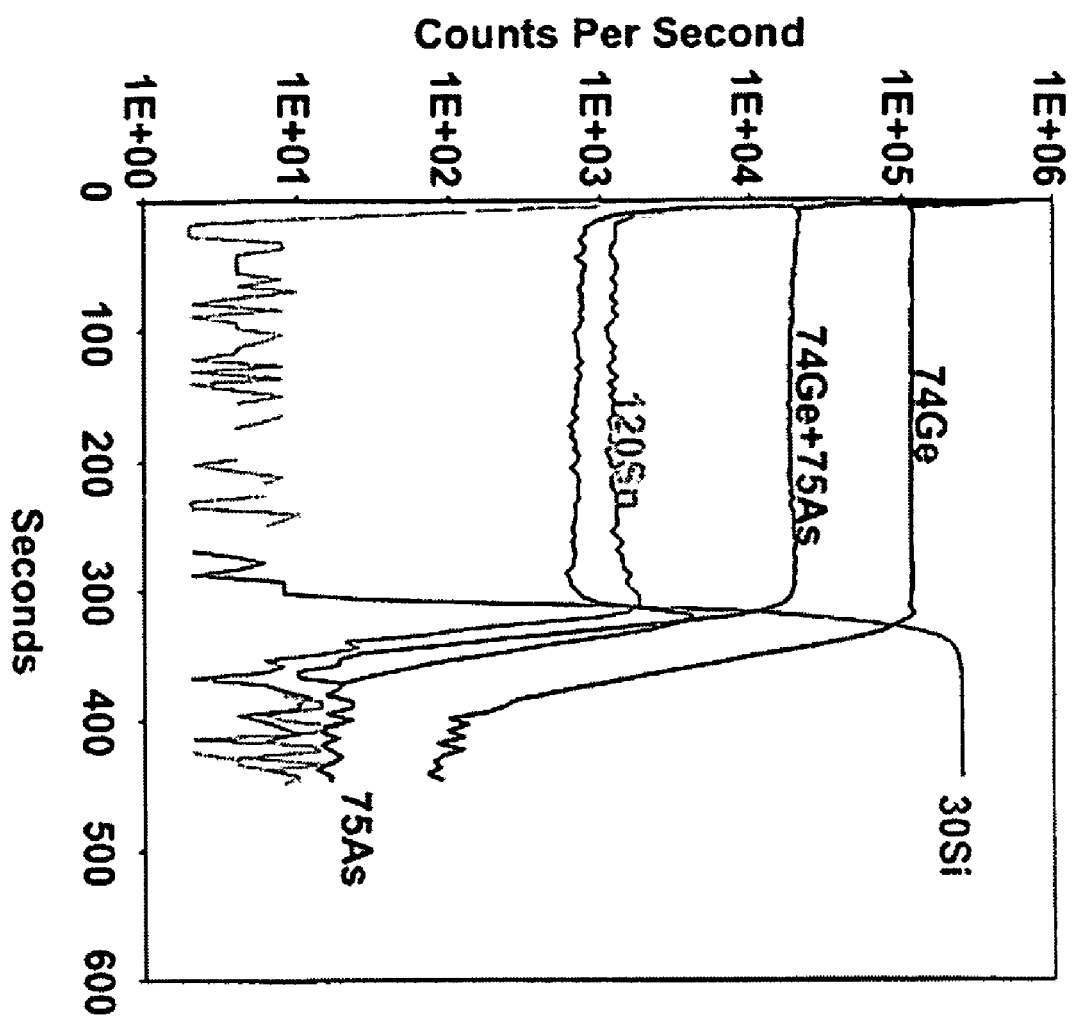
Figure 12:
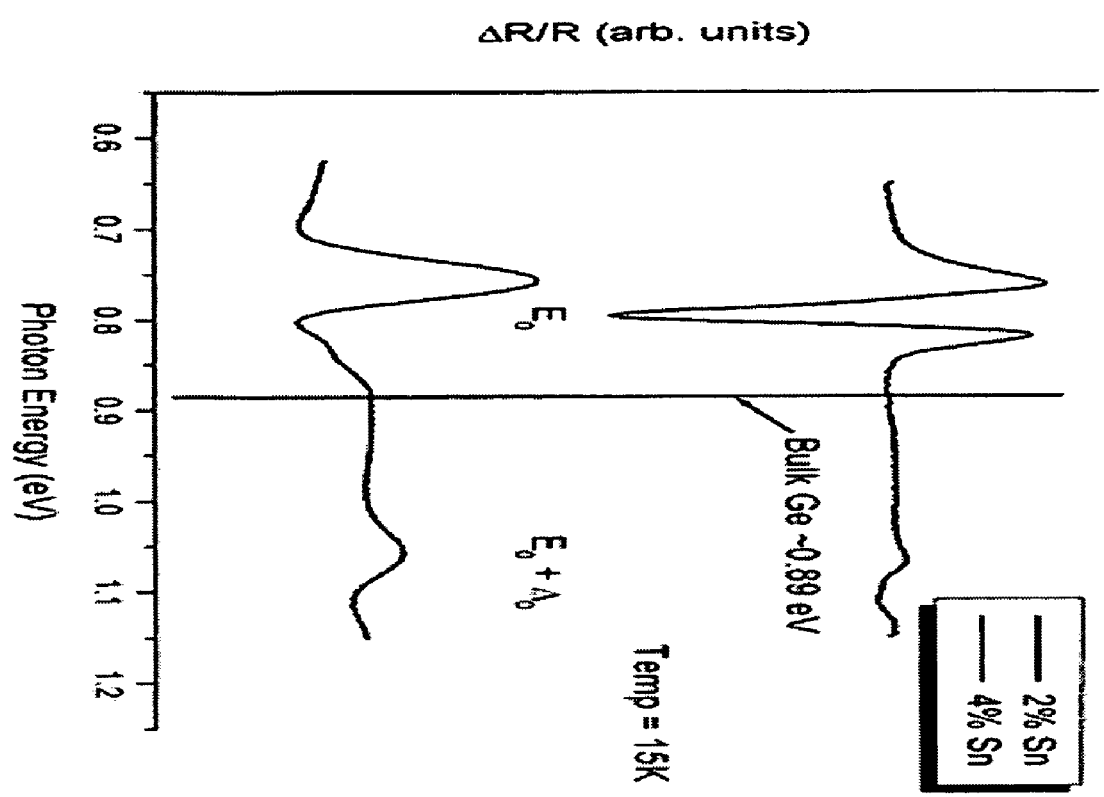
Figure 13:
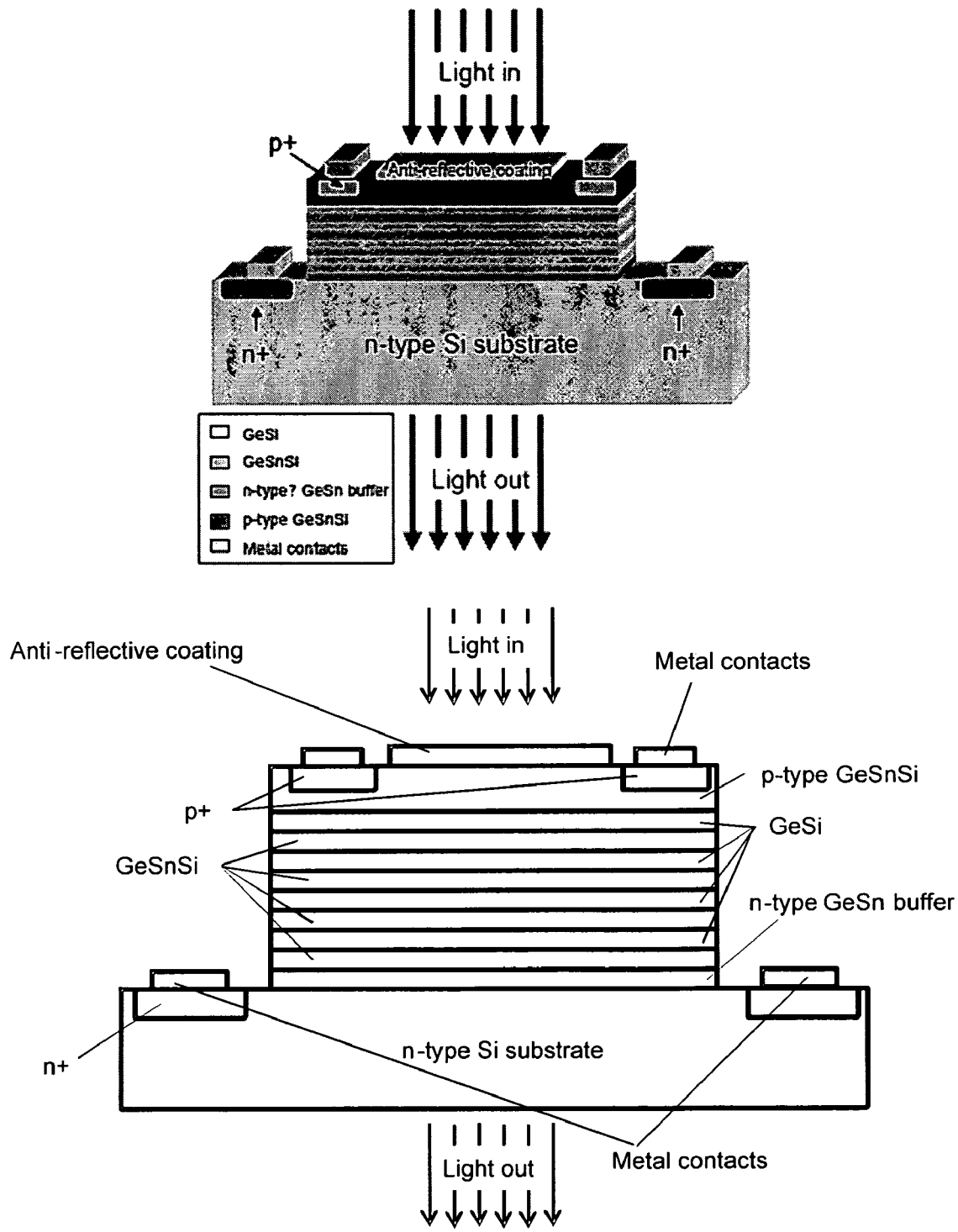
Figure 14:
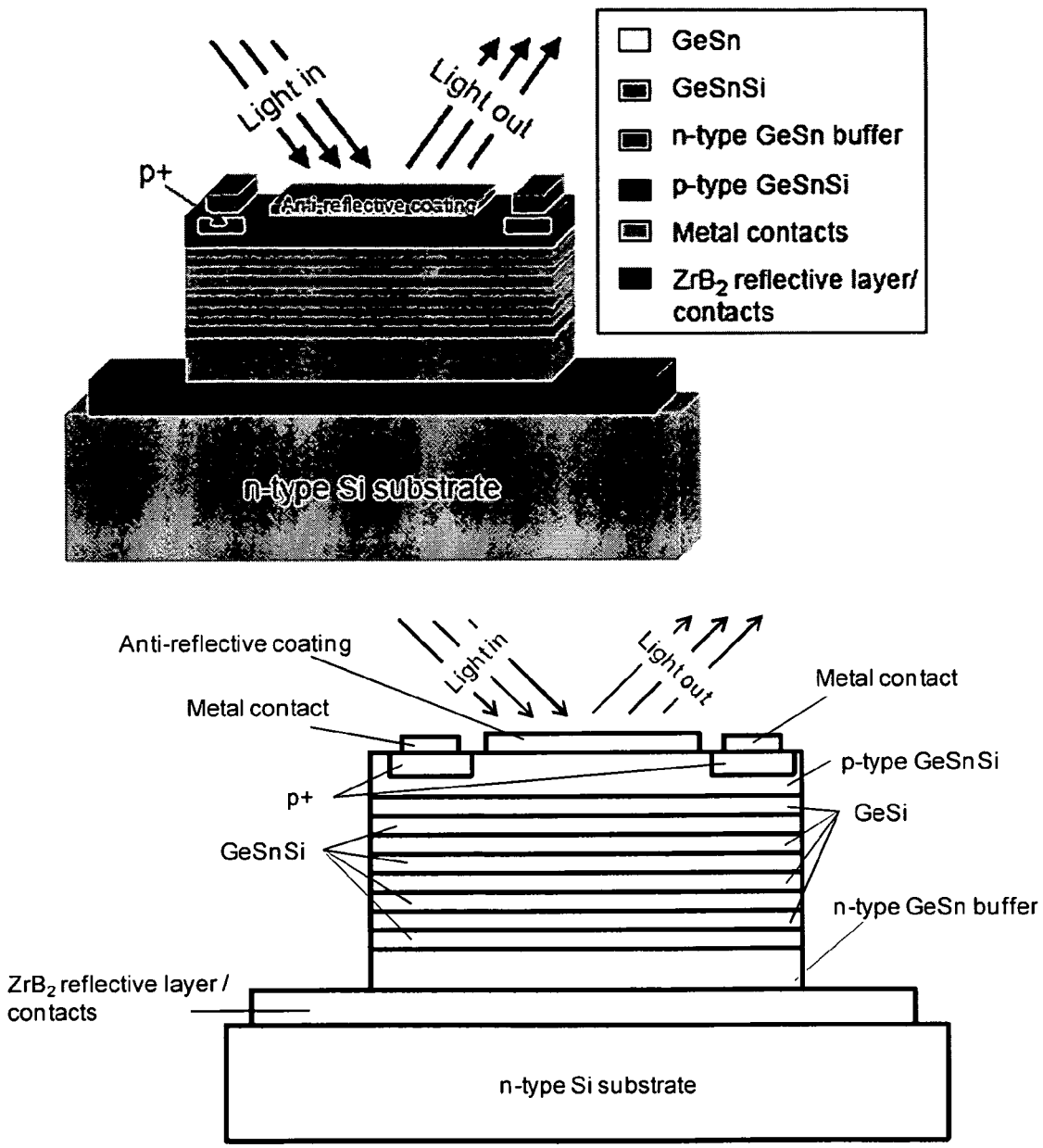
Figure 15:
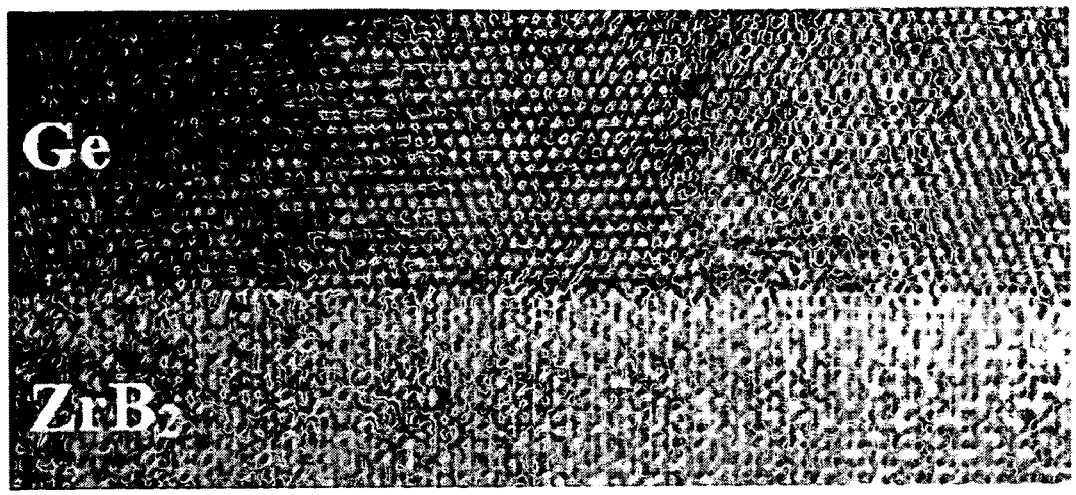
Figure 16:
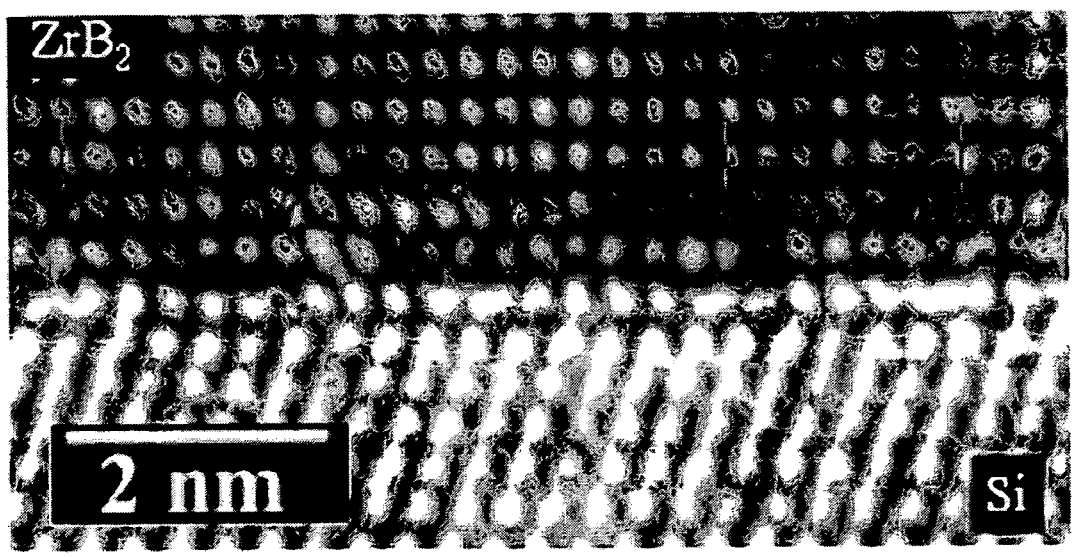

XTEM of the entire heterostructure; (c) Si/$Sn_{0.02}Ge_{0.98}$ interface (indicated by arrow); and (d) $Si_{0.20}Sn_{0.08}Ge_{0.72}$/$Sn_{0.02}Ge_{0.98}$ interface;

FIG. 2 shows reciprocal space maps showing the (224) reflections of $Sn_{0.02}Ge_{0.98}$ buffer layer, $Si_{0.20}Ge_{0.70}Sn_{0.10}$ epilayer and Si substrate relative to the Si peak. The (004) peaks are shown in the inset. The data is given for $c_{SiGeSn}$=5.728 Å and $c_{GeSn}$=5.681 Å. The corresponding in-plane lattice parameters are virtually identical. For full relaxation, the epilayer peak lies on the line connecting the Si peak to the origin. The data show that this line passes through the center of GeSn peak, consistent with fully relaxed GeSn grown on Si. Note that the SiGeSn layer falls directly below the SnGe buffer indicating that its in-plane lattice constant matches that of GeSn. The film is thus fully strained with respect to the buffer layer;

FIG. 3 shows silicon concentration in a SiGe alloy ($x_2$) versus Si concentration in a SiGeSn alloy ($x_1$) with 10% Sn;

FIG. 4 shows energy bands at a SiGeSn/SiGe interface. The lines 100 correspond to the SiGe bands. The black lines correspond to the SiGeSn bands. The zero of energy is at the top of the valence band in the SiGeSn alloy. The Sn concentration is y=0.1. In this model, the valence band offset depends only on y. Further, there is a substantial conduction band offset for $x_1$<0.6;

FIG. 5 shows the band gap of the SiGeSn/SiGe heterostructure shown in FIG. 4;

FIG. 6 shows band offsets at the SiGeSn/SiGe heterostructure shown in FIG. 4. The lines 102 are the conduction band offsets. The lower line corresponds to the minimum band offset, the upper line to the offset between states with the same L-symmetry. The line 104 is the valence band offset;

FIG. 7 shows a strain-free single quantum well structure with a band gap of 0.8 eV (1.55 microns) grown on a previously synthesized lattice matched $Ge_{0.78}Si_{0.20}Sn_{0.02}$ buffer layer;

FIG. 8 shows: (a) XTEM micrograph and SAED of Si(100)/$Ge_{0.97}Sn_{0.03}$/$Ge_{0.78}Si_{0.20}Sn_{0.02}$ showing smooth, continuous surface morphology and low defect densities. The total film thickness is 220 nm; (b) high resolution XTEM image of the $Ge_{0.97}Sn_{0.03}$/$Ge_{0.78}Si_{0.20}Sn_{0.02}$ interface indicating perfect epitaxial alignment; (c) AFM image showing smooth surface topology (RMS=1 nm). The lattice parameter of the top layer (0.562 nm) is identical to that of the quantum well structure shown in FIG. 7 indicating that this film may be an effective buffer layer for the materials disclosed herein;

FIG. 9 shows a strain-free multi-quantum well with a band gap of 0.8 eV (1.55 microns) grown on a $Ge_{1-x}Si_xSn_{0.02}$ buffer layer;

FIG. 10 shows absorption coefficients of bulk Ge and a $Sn_{0.02}Ge_{0.98}$ film grown on Si;

FIG. 11 shows the SIMS elemental profile of $Ge_{0.95}Sn_{0.05}$ containing a highly uniform As concentration throughout the sample;

FIG. 12 shows typical PR spectra obtained at 15K for GeSn alloys showing a shift of the direct band gap $E_0$ relative to that of pure Ge (the 4% Sn has a phase difference due to surface depletion);

FIG. 13 shows a simple demonstration of a modulator operating in transmission at 1.55 μm. The Si substrate is transparent at 1.55 μm;

FIG. 14 shows a reflective modulator based on Si—Sn—Ge/GeSi quantum wells. The quarter wave mirror stack in this case will be replaced by a single layer of conductive and completely reflective $ZrB_2$;

FIG. 15 shows an XTEM interface image of an epitaxial Ge film grown on a $ZrB_2$ buffer layer; and FIG. 16 shows an interface image showing epitaxial alignment of $ZrB_2$ with Si. Periodic defects at interface (shown by arrows) are due to the lattice mismatch.

DETAILED DESCRIPTION

Previous Sn—Ge and Si—Ge—Sn Alloy Systems

Prior Sn—Ge alloy systems: The growth of $Ge_{1-x}Sn_x$ alloys has been hampered by the enormous lattice mismatch (15%) between Ge and α-Sn as well as by the instability of the cubic α-Sn structure above 13° C. As a result, such alloy systems have been highly metastable and, therefore, not amenable to being produced in bulk form. Nevertheless, significant efforts have been devoted to growing $Sn_xGe_{1-x}$ films by molecular beam Epitaxy (MBE).[5a,b] However, such approaches also have certain drawbacks. For instance, one problem encountered with MBE techniques is the propensity of the Sn to segregate towards the film surface. Another problem is the low thermal stability and crystal quality of MBE grown materials.

These drawbacks are addressed by the CVD techniques described herein. These CVD techniques allow for the production of device-quality single-crystal, $Sn_xGe_{1-x}$ alloys (with x=0.02-0.2) that may be grown directly on Si(100).[6-10] The films grow strain-free with thickness of at least 1 μm. These films display smooth surface topologies and extremely low defect densities. While these films do show some defects, these defects are primarily Lomer edge dislocations that are concentrated at the Si interface with substantially no dislocation cores propagating to the film surface. Using the approaches described herein, a substantially defect-free surface for such an alloy may be achieved in films having a thickness of 20-25 nm.

Furthermore, alloy systems described herein also address the thermal stability concerns described above. For example, the thermal stability of alloy samples with a Sn content in the range of 2-5% is between 750° C. and 650° C., respectively. This temperature range is well within the temperature processing range of typically CMOS manufacturing processes.

The optical properties of the materials disclosed herein also exhibit a well-defined Ge-like band structure and have a strong compositional dependence in the band gap energies. A systematic narrowing of the direct band gap $E_o$ and critical point energies with increasing Sn concentration is observed ($E_o$ is reduced monotonically from 0.74 eV for $Ge_{0.98}Sn_{0.02}$ to 0.41 eV for $Ge_{0.86}Sn_{0.14}$).[11-13]

The optical properties of MBE films (as discussed above) differ markedly from the materials disclosed here and the optical properties of conventional semiconductor alloys.[5b] In MBE films and conventional semiconductor alloys, individual interband transitions are not observed, and the position of the band edges is obtained from fits that must incorporate transitions not found in pure Ge.

In contrast, the materials disclosed here (e.g., GeSn alloys) represent a significant breakthrough from the point of view of achieving epitaxial growth of strain-free materials directly on Si. Unlike other groups, these alloy materials display a Ge-like band structure, which demonstrates that $Ge_{1-x}Sn_x$ alloys are viable candidates for a variety of novel devices. Ellipsometry, and photoreflectance data taken on the disclosed materials closely resembles spectra for pure Ge. This data allows for the identification of optical transitions in the materials and demonstrates the much higher quality (e.g., device quality) of the disclosed materials as compared to MBE grown films. Furthermore, such materials allow for highly efficient Rutherford back scattering (RBS) channeling by the Sn and the Ge. This material characteristic is important because it allow for the substitutionality of Sn in such alloys to be clearly demonstrated.

Si—Ge—Sn alloy systems: Device-quality Si—Ge—Sn ternary materials that possess a variable and controllable range of compositions and exhibit lattice constants above and below that of bulk Ge[14,15] are also disclosed. These materials form more readily and exhibit even greater thermal stability than their Sn—Ge counterparts. Combined with the $Sn_xGe_{1-x}$ films disclosed herein, the new ternary system provides unprecedented flexibility for band gap and strain engineering in group IV alloys. Possible applications (aside from the photonic devices highlighted in the previous sections) include buffer layers for growth of relaxed SiGe alloys with high Ge content to be used in the modulator device structures described in this proposal and barrier layers for novel type I direct gap Ge quantum wells.[4]

Figure 1:
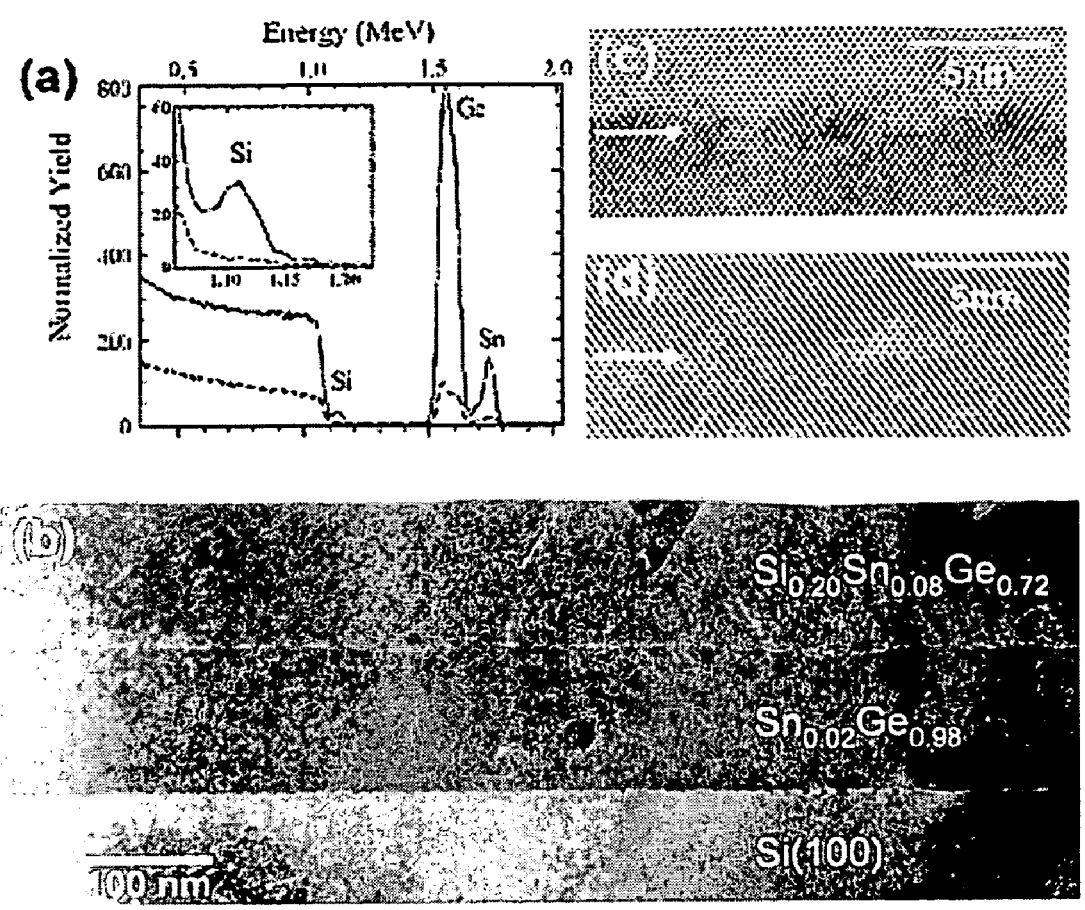
FIG. 1 shows: (a) RBS aligned (dotted line) and random (solid line) spectra of $Si_{0.20}Sn_{0.08}Ge_{0.72}$ epilayer and $Sn_{0.02}Ge_{0.98}$ buffer layer showing a highly aligned heterostructure (Inset: magnified view of the Si peak indicating complete substitutionality of Si in the Sn—Ge lattice); (b)

Example ternaries $Ge_{1-x-y}Sn_xSi_y$ described herein are grown on Si(100) using $Ge_{1-x}Sn_x$ alloy buffer layers as illustrated by the RBS and TEM data shown in FIG. 1. In FIG. 1, the crystal structure, elemental distribution and morphological properties of the heterostructures are characterized by high-resolution TEM, including electron energy loss nanospectroscopy, x-ray diffraction and AFM. These techniques demonstrate growth of very high-quality epitaxial, uniform and highly aligned layers with atomically smooth surfaces and monocrystalline structures that have lattice constants close to that of Ge. RBS ion channeling shows that the constituent elements occupy random substitutional sites in the same average diamond cubic lattice and the Raman shifts are consistent with the lattice expansion produced by the Sn incorporation into SiGe tetrahedral sites.

The structural and strain properties of these materials are still relatively unknown and a multidisciplinary effort to evaluate these properties is in currently progress. The lattice constant of such materials as a function of composition (especially deviations from linearity) and their strain when grown on Si may be investigated by high resolution x-ray diffraction (XRD).

FIG. 2 illustrates an x-ray reciprocal space map data of a $Si_{0.20}Sn_{0.10}Ge_{0.70}/Sn_{0.02}Ge_{0.98}/Si(100)$ heterostructure. The data in FIG. 2 indicate a fully strained SiGeSn epilayer with respect to the relaxed GeSn buffer layer. Related studies have shown that tensile strained as well as relaxed SiGeSn films can be obtained on strain-free GeSn buffer layers. These results are significant because they demonstrate that strain engineering can be achieved in SiGeSn heterostructures and multilayers by tuning (adjusting) the lattice parameter of the GeSn buffer layer. A host of strained engineered optical and electronic devices may be designed based on this concept.[4] It is noted that the strain of such material systems is mechanically reliable up to at least 400-500° C. (where 400° C. is the growth temperature for the films).

Using the methods and materials described herein, various combinations of concentrations in the Si—Ge—Sn alloy system to form strained-layer heterostructures may be achieved. For instance, $Ge_{1-x-y}Sn_xSi_y$ on $Ge_{1-x}Sn_x$ buffers, where the strain of the ternary can be tuned by adjusting the Si content in the film or the Sn content in the buffer may be produced. Further, the growth of strained Ge films on $Ge_{1-x}Sn_x$ buffers may also be achieved. As was noted above, theory suggests that tensile Ge layers will operate as direct bandgap materials when the Sn content in the buffer layer exceeds 10 at. %.[16,17] Other technologically relevant systems include the growth of strained Si on Si-rich $Si_yGe_{1-y}$, where the quality of the $Si_yGe_{1-y}$ buffer is improved through incorporation of a small amount of Sn.

Strain Free, Lattice Matched, $Ge_{1-x1-y}Si_{x1}Sn_y/Ge_{1-x2}Si_{x2}$ Heterostructures on Si(100) for QCSE Applications The availability of ternary SiGeSn alloys as described herein provides for substantial flexibility for band gap and strain engineering in group-IV heterostructures. As is described herein, use of these materials to design and grow interesting optical devices integrated with silicon such as simple modulators based on the Quantum Confined Stark Effect (QCSE) (which is essentially a shift in the energy levels of the structure and the resulting transition energies when an electric field is applied). Studies of quantum well structures based on Si/SiGe suggest that such systems are not ideally suited for optical modulation applications due to their inherently small conduction band offsets.[18-23] An additional complication of such systems is that the Si/SiGe system has an indirect band gap. Therefore, the first direct transition is at much higher energies (for Si-rich alloys), so that the near band absorption coefficient is reduced relative to direct-gap group III-V systems. Thus, many multiple-quantum well periods are needed to achieve the required on-off ratios, but this approach may then conflict with a desire to maintain the epitaxial strain.[24]

SiGeSn/SiGe systems as disclosed herein address at least some of the difficulties mentioned above. For instance, the addition of Sn allow for the design of substantially strain-free structures that can accommodate multi-quantum well systems with an arbitrary number of periods, and at the same time are likely to display much larger band offsets. Moreover, while such systems are still indirect gap materials, the indirect and direct edges are much closer in energy than in Si-rich SiGe alloys, so that there should be increased absorption due to oscillator strength "borrowing" induced by alloy fluctuations. FIG. 4 illustrates these concepts.

In FIG. 4, a graph that illustrates the electronic bands of $Ge_{1-x_1-y}Si_{x_1}Sn_y/Ge_{1-x_2}Si_{x_2}$ heterostructures for which the concentrations $x_1$ and $x_2$ are chosen so that the two components are lattice-matched are shown. Using Vegard's law (which is known to those working in this area), the resulting concentrations are shown in FIG. 3 for the case of y=0.1. All subsequent calculations presented here are based on this fixed Sn concentration, which is readily attainable. Notice that for about 40% Si concentration and 10% Sn concentration, the SiGeSn layer is very close to being lattice-matched with pure Ge. As demonstrated by FIG. 4, the band lineup depends on a number of parameters. For instance, one important such parameter is the dependence of the average valence band offset on Sn concentration. The data in FIG. 4 is based on a theoretical model developed by Jaros, which matches well with experimentally known band offsets.[24]

In FIG. 4, a region of interest is the range of $0.4<x_1<0.6$. In this range, both holes and electrons are localized in the SiGe layer and there is a substantial conduction band offset. The band gap for those concentrations is the difference between the CB_L_x2 and the VB_x2 band edges. This band gap covers the industry important 1.55 μm range and is shown in further detail in FIG. 5.

Data shows that relaxed $Ge_{1-x_1-y}Si_{x_1}Sn_y/Ge_{1-x_2}Si_{x_2}$ is type-I, with both electrons and holes confined in the $Ge_{1-x_2}Si_{x_2}$ layers. The conduction band offsets are much larger than in the Si/SiGe system, so that the heterostructures disclosed herein are good candidates for the observation of the QCSE. This conclusion is apparent from FIG. 4 and is displayed in more detail in FIG. 6.

As shown in FIG. 6, the valence band offset is larger than 100 meV and the conduction band offset is larger than 100 meV over a significant range. Moreover, the smallest conduction band offset shown in FIG. 6 is between the L-type states on the SiGe side and the X-type states on the SiGeSn side. However, the effective barrier for electrons is more likely to be the difference between the L states on both sides of the heterojunction. This offset is shown as the upper line 102 in FIG. 6. As is shown in FIG. 6, this offset is nearly 350 meV, which is very substantial. Based on this offset, it may be concluded that such a heterostructure will provide strong confinement of both electrons and holes.

In the event that the band lineup of such structures is not suitable for a specific application, such structures may be further "tuned" using stress/strain. For instance, the band structure may be further adjusted by changing the compositions in such a way that the added effect of strain leads to the desired band alignment. Because layers with lattice constants above and below the lattice constant of Ge can be grown using the techniques described herein, any sign of strain (positive or negative) is attainable. The effect of strain on the electronic bands has been comprehended in the models discussed here. Therefore, calculations with strain as an extra "dimension" are very straightforward from these models. Moreover, these principles allow for the design of strain-compensated structures that are not substantially limited in total device length.

Growth, Structural, Optical and Electrical Properties.

Quantum wells based on a $Ge_{1-x1-y}Si_{x1}Sn_y/Ge_{1-x2}Si_{x2}$ system may be grown based on the theoretical models presented in the previous section. In one embodiment of such a quantum well, the Si concentration (x1) of the $Ge_{1-x1-y}Si_{x1}Sn_y$ layer of the device targets the range of 40-60 at. % while the corresponding Si concentrations (x2) of the $Ge_{1-x2}Si_{x2}$ film are between 5-25 at. %, respectively. The matching bandgaps for the proposed heterostructures will vary from 0.65 eV and 0.9 eV, respectively, based on the model illustrated in FIG. 5.

Initially, single quantum wells (SQWs) based on selected lattice matched structures discussed above may be grown. Growth of these SQWs may then be followed by the growth of multiple-quantum well structures, as are described below. Example, simple SQW structures are useful as an initial demonstration of the QCSE using photoluminescence, and for the measurement of band offsets using inelastic light scattering. With information collected from experiments on such SQW structures, modification to structure design can be made and MQW systems may be produced. An example SQW system includes a thin layer of $Si_{0.15}Ge_{0.85}$—$Si_{0.20}Ge_{0.80}$ sandwiched between two thick layers of SiGeSn. Such a structure is illustrated in FIG. 7. This material has a bandgap of 0.8 eV corresponding to a technologically important wavelength of operation for communication applications (1550 nm). Such material may be grown on lattice matched Si—Ge—Sn based buffer layers.

Various approaches for preparation of buffer layers may be used. One such approach is based on lattice-matched templates, such as with a composition $Sn_{0.03}Ge_{0.97}/Ge_{0.78}Si_{0.20}Sn_{0.02}$, as is shown schematically in FIG. 7. FIG. 8 illustrates such a material grown directly on Si (100). The structural morphological and crystallographic properties of the material were determined by high resolution x-ray diffraction, AFM and high resolution electron microscopy. The data indicate that this material is suitable as a template for the growth of a $Ge_{0.40}Si_{0.50}Sn_{0.10}/Ge_{0.85}Si_{0.15}$ device particularly since the experimentally determined lattice parameter of the $Ge_{0.78}Si_{0.20}Sn_{0.02}$ top layer of the template equals that of the device as determined by Vegard's Law.

Another buffer-layer approach is based on a graded $Ge_{1-x}Si_xSn_{0.02}$ layer grown on Si(100), followed by in situ CVD growth of the $Ge_{1-x1-y}Si_{x1}Sn_y/Ge_{1-x2}Si_{x2}$ overlayers. FIG. 9 illustrates an example MQW structure based on this approach. The starting composition of the buffer layer is essentially pure Sn—Ge with a composition close to $Ge_{0.98}Sn_{0.02}$ at the substrate interface. Above the interface, the composition is graded via incorporation of Si (by adjusting the proportions of the reactant gases accordingly) to form a SiGeSn buffer layer with a lattice constant that is close to that of the $Si_{x2}Ge_{1-x2}$ component of the device.

We have chosen the Sn—Ge alloys to be used as buffer layers because they possess crystallographic, morphological and mechanical properties that make them uniquely suitable for use as templates on Si substrates. These alloys grow as uniform, substantially strain-free layers with essentially smooth and continuous surface morphologies (e.g., typical AFM rms values are 0.5-1.0 nm) and display extremely low concentrations of threading defects, particularly those that extend to the uppermost surface. In comparison, the quality of pure Ge films grown on Si by similar methods is typically much worse. In addition, such alloys are high compressibility (softer) solids as compared to either Si or SiGe and they can act as spacers that conform structurally and absorb the differential strain imposed by more rigid Si and Si—Ge layers. Another potential advantage of Sn—Ge buffer layers is that such layers are not expected to absorb any significant amount of light emitted by heterostructures formed on such buffer layers. Based on IR measurements, the absorption of a common buffer layer with composition $Ge_{0.98}Sn_{0.02}$ is approximately $10^4$ $cm^{-1}$ in the energy range of 1.9 to 0.7 eV, which is illustrated in FIG. 10. This indicates that a nominal thickness of 10-100 nm is essentially non-absorbing and clearly suitable for device application.

Growth Strategies: GeSn buffer layers may be grown directly on Si(100) using unique CVD procedures. The $Ge_{1-x}Si_x$ component of the heterostructure is synthesized via reactions of appropriate amounts of the custom made and highly-reactive gaseous species $H_2Si(GeH_3)_2$ and $HSi(GeH_3)_3$ with commercially available mixtures of $Ge_2H_6$ (digermane) and $H_2$. Deposition experiments involving the unimolecular dehydrogenation of $H_2Si(GeH_3)_2$ directly on Si (100) via this approach using a gas source MBE reactor equipped with a low energy electron microscope have shown that the entire deposition process may be monitored in situ in real time. Ge-rich Si—Ge films with variable concentration in the target range of $Ge_{67}Si_{33}$ and thickness of 40-80 nm were obtained between 480° C.-550° C. These materials displayed substantially completely smooth surface morphologies (rms 0.3-0.4 nm), low defect densities and were of superior quality to those with similar concentrations obtained by conventional CVD and/or MBE. These results indicate that such low temperature methods are especially applicable for growing the desired $Ge_{1-x}Si_x$ component of the heterostructure.

In an example embodiment, $Ge_{1-x1-y}Si_{x1}Sn_y$ layers of a heterostructure device are grown on a $Ge_{1-x2}Si_{x2}$ layers using a synthesis method involving UHV-CVD reactions of specially prepared hydride precursors {i.e. $SiH_3GeH_3$ or $(SiH_3)_2GeH_2$} with $SnD_4$. The desired film composition and thickness is controlled via appropriate precursor design, suitable concentrations of reactants and optimal growth conditions such as reactor pressure, temperature and flow rates. For example, the hypothetical $Ge_{0.30}Si_{0.60}Sn_{0.10}$ composition will be formed by using a $(SiH_3)_2GeH_2$ derivative as the source of Si and Ge. The entire $Si_2Ge$ concentration of two Si atoms and one Ge atom in the precursor is then incorporated in the film.

Characterization: High resolution TEM may be used to evaluate he microstructural properties (heteroepitaxial character, layer thickness, topology and defect densities). Data from such evaluation is then used to adjust the growth conditions and ultimately produce material with desired crystal quality for device applications. The Si Ge and Sn concentration and layer thickness is obtained by RBS. Complementary ion channeling experiments may be used to investigate the epitaxial alignment of the films and the substitutionality of the constituent elements in the structure.

Strain as a function of buffer layer lattice dimensions, as well as other basic structural and morphological properties may be evaluated by high-resolution x-ray diffraction and atomic force microscopy. High resolution x-ray measurements including symmetric and asymmetric diffraction scans, rocking curves, reciprocal space maps, glancing incidence diffraction and reflectivity play a crucial role in the determination of key properties such as heteroepitaxial alignment, superlattice periodicity, lattice strain and relaxation, mismatch and composition, layer thickness and interface quality, etc. An x-ray diffractometer equipped with a hot stage which can reach temperatures up to 900° C. allows for investigation of the thermal stability of the layers, thermal expansion coefficients, and the strain relaxation of the alloys on Si.

Hall measurements may be used to determine free carrier concentration, carrier polarity type and mobility as a function of temperature. P and N doping procedures may be developed as is described below.

Doping of the Si—Ge—Sn Alloys: The need for doped layers in modulator devices, such as those disclosed herein, in combination with the disadvantages of current doping techniques demonstrates that alternative approaches for doping Si—Ge—Sn alloys in situ are desirable. For instance, Si and Si—Ge are currently doped with B using diborane, and with As by implantation methods, but there are limits to how much dopant can be incorporated into the structure using such techniques. For Si—Ge—Sn systems, there is also a risk of damaging the relatively "soft" structure using implantation processes. Accordingly, doping protocols that include in situ incorporation of the dopant atoms using custom prepared As, B, and P hydride precursors are employed to dope the structures disclosed herein. These compounds are co-deposited with appropriate Si/Ge/Sn sources to from Sn—Ge or Si—Ge—Sn doped with the appropriate carrier type. In the case of As, increases in the free carrier concentration are achieved using such techniques by building precursors with direct Ge—As bonds such as $As(GeH_3)_3$. This compound has been synthesized, as well as the $P(GeH_3)_3$ analog compound. These unique species are excellent molecular sources for low temperature, low cost, high efficiency doping applications that are conducted via simple, single-step processes. The compounds are carbon-free inorganic hydrides and are designed to furnish a basic structural unit comprised of the dopant atom surrounded by three Ge atoms. This arrangement produces homogeneous, substitution of dopant atoms at high concentrations without clustering or segregation. We use low energy secondary ion mass spectrometry (SIMS) to determine the As elemental profile and Hall/FTIR ellipsometry measurements to determine carrier concentrations and effective masses. FIG. 11 shows a typical SIMS profile illustrating highly uniform elemental distribution. These data are used to quantify the dopant content (implanted samples of known concentration are used as standards). XTEM and RBS analysis indicate good crystal quality of all Ge—Sn:As films. IR ellipsometry indicates that doping levels of $\sim 5\times10^{19}/cm^3$ have been achieved.

Optical Characterization: Possible optical characterization experimental techniques include photoluminescence (PL), inelastic light scattering, spectroscopic ellipsometry and photoreflectance (see FIG. 12 for a typical PR spectrum of materials described herein). PL may be used to determine the system's band gap energy and to study the QCSE through the resulting shift in emission energies. Inelastic light scattering may be used to measure band offsets. It has been shown that inelastic light scattering is a highly sensitive method for the measurement of band offsets [See, J. Menéndez and A. Pinczuk, IEEE J. Quantum Elec. 24, 1698 (1988), which is incorporated by reference herein in its entirety]. This method has historically not been applied to Si/SiGe quantum well systems because it cannot be used if the lowest conduction band edge is of X-type, as is the case in SiGe alloys with high Si concentration. However, in the material (alloy) systems disclosed herein the lowest conduction band edge is generally at the L-point of the Brillouin zone. This arrangement is desirable for light scattering, because the scattering cross section can be resonantly enhanced by working in resonance with the $E_1$ gap of the system. Moreover, the light scattering experiments are performed with visible laser excitation whereas photoluminescence occurs in the infrared range, so that there is essentially no overlap that could obscure the measurements.

SiGeSn layers of various compositions may be grown for characterization with spectroscopic ellipsometry (from the infrared to the visible) and photoreflectance. A goal of such characterization is to determine the compositional dependence of the optical transitions and properties relevant to our modeling efforts, including refractive index.

Theoretical Modeling: The purpose of the theoretical modeling described herein is at least twofold: (i) to generate more realistic band offsets and (ii) to study the elastic properties of SiGeSn in detail. It is well known that density functional theory within the local-density-approximation makes very accurate predictions of ground-state properties in semiconductors. This includes lattice parameters, elastic constants, and the potential steps at heterojunctions, which determine band offsets. Corresponding structural work may be focused on the compositional dependence of lattice constants and elastic constants. The lattice constants and elastic constants are of interest because they determine the distribution of strain. Tetragonal distortion under biaxial strain depends on the ratio $C_{11}/C_{12}$ of lattice constants. This ratio is about the same in Si and Ge, so that we can safely interpolate in the case of SiGe alloys. However, the deviation with Sn is larger, and so the compositional dependence of the $C_{11}/C_{12}$ ratio requires some theoretical modeling.

First principles and semi-empirical quantum mechanical simulation methodologies are employed in such analyses. Ionic pseudopotentials are used to eliminate the core electrons from the physical description. The remaining valence electron density is expanded in a plane-wave basis, and density functional theory is used to obtain the electronic structure. Atomic forces and cellular stresses obtained from the resulting wavefunctions are then minimized to yield a prediction for the ground state atomic/ionic configuration of a target material. The electronic band-structure is also available as a function of composition at every stage of the calculation and allows us to compute local fields, band-offsets, chemical potentials, polarizability tensors, elastic constants, work functions, space charge and many other key properties of a semiconductor system.

Free surfaces and interfaces are of interest since they play a prominent role in device design. Band offsets and Schottky barriers are computed from spatial moments of the induced charge density at the interface between two materials. The potential line-up obtained in this way is sensitive to the chemical and structural properties of the interface. The valence band offset is calculated by summing the potential offset and the valence-band edge difference between the two interface materials. The latter are obtained from conventional bulk band-structure calculations. Using this procedure the effect of bulk and interface strain effects on the valence band offset can be estimated and compared with experimental data as part of a comprehensive band-engineering/materials design approach. The effects of compositional variation on both the valence and conduction band offsets can thus be systematically and efficiently explored.

Refinement of Design and Multiple-Quantum Well Growth.

Experimental information may be collected on various parameters that affect the design of the material (e.g., alloy and heterostructure) systems disclosed herein. These parameter include:

1) Experimentally measured lattice constants as a function of composition;

2) Experimentally measured compositional dependence of optical transitions;

3) Experimentally measured band offsets; and

4) More realistic estimates of band offsets and structural properties.

Using the above experimental information the structures described herein may be redesigned to achieve the desired large valence and conduction band offsets. If needed, strain engineering may be implemented to manipulate the offsets. Once a final set of parameters is identified for SWQ structures, growth of the MQW structures (e.g., as are required for modulators) may then be pursued. A schematic illustrating such a modulator structure is shown in FIG. 13. The modulation properties of such a quantum well stacks may be evaluated using photocurrent spectroscopy.

In the previous sections it has been assumed that the disclosed QCSE modulator operates via electroabsorption. This leads to a modulation of the light intensity. In addition, there is a phase modulation produced by electric-field induced changes in the index of refraction. This is commonly known as electrorefraction. The phase modulation can be converted into intensity modulations by fabricating interferometric devices using waveguides. Our proposed SiGeSn/SiGe quantum well structures are very attractive from this perspective due to their high index of refraction. Since we are working with high Ge concentrations and we add Sn, the refractive indices of the buffer and quantum wells (QWs) are expected to be significantly larger than 3.5 (e.g., a measured refractive index for a $Sn_{0.02}Ge_{0.98}$ film at the approximate energy of the indirect gap is 4.2), so that the silicon substrate will provide bottom confinement. Air or low temperature oxide (LTO) may provide top confinement. Hence, the fabrication of waveguides appears to be very straightforward. In addition, the electromodulation of such structures is not sensitive to the details of the near band gap band structure (the index of refraction depends on the entire band structure), so that the strength of the electrorefraction effect in the alloys described herein should be comparable to the average for bulk elemental semiconductors. One concern for these types of structures is possible losses due to sidewall roughness.

While the techniques described herein have been described generally with respect to structures based on the electroabsorption mechanism, such techniques may also be used to fabricate simple waveguide structures and study their transmission properties. For instance, electron refraction modulators based on the same compositions as the electroabsorption devices would likely operate at somewhat longer wavelengths. Obviously, the operating wavelength could be adjusted by slightly modifying the compositions.

Development of a Reflective Modulator Utilizing Metallic and Reflecting $ZrB_2$

A simple and efficient approach for incorporating a reflective modulator structure with a Si substrate includes growth of $ZrB_2$ thin epitaxial layers directly on the Si. This $ZrB_2$ material will serve as the template for the subsequent growth of the appropriate Ge—Sn or SiGeSn buffer layers upon which the modulator structure will be built. The $ZrB_2$ phase is structurally compatible with Si and GeSn, is metallic and is substantially completely reflective. Epitaxial growth of metallic and reflecting $ZrB_2$ films directly on Si (111) in spite of the large mismatch in the in-plane lattice dimensions between Si(111) where a=3.84 Å and $ZrB_2$ where a=3.17 Å[25] has been achieved. The misfit at the interface is taken up by a pure edge-type dislocation from the insertion of extra {1100} lattice planes along the [1120] direction. No threading dislocations propagating in a direction normal to the substrate were observed.

The $ZrB_2$ layer on Si(111) would provide a near lattice-matched template for subsequent growth of epitaxial nitrides (GaN and InGaN).[26] In addition, $ZrB_2$ would serve as a reflecting intermediate layer, which prevents any substantial loss of emission intensity from the light emitting overlayer into the absorbing Si substrate, thus allowing for integration of nitride electronics with conventional Si electronics.[27] The epitaxial alignment between Si and $ZrB_2$ suggests that growth of Ge and SnGe on $ZrB_2$ might be possible. The successful growth of these materials on reflecting surfaces would have important applications in IR devices such as the reflective modulator structure illustrated in FIG. 14.

The result of pure Ge grown on a $ZrB_2$/Si heterostructure via deposition of digermane $(Ge_2H_6)$ at 450° C. is shown in FIGS. 15 and 16. In FIG. 15, the result of XTEM studies are shown that reveal highly coherent Ge films with near perfect epitaxial alignment with the $ZrB_2$ buffer layer. This method may then be extended to grow GeSn and SiGeSn films on $ZrB_2$. These materials may then be used as buffer layers for the subsequent growth of a $Ge_{1-x1-y}Si_{x1}Sn_y/Ge_{1-x2}Si_{x2}$ quantum well structure, such as a modulator device with a wavelength preferably around 1.55 μm (e.g., the structure shown in FIG. 15). The high reflectivity of $ZrB_2$, at this wavelength provides for a revolutionary and highly simplified replacement to the conventional wave mirror stack. Spectroscopic ellipsometry may be extensively used to determine the optimum $ZrB_2$ thickness that would provide the desired reflective properties.

CONCLUSION

While a number of aspects and embodiments have been discussed above, it will be appreciated that various modifications, permutations, additions and/or sub-combinations of these aspects and embodiments are possible. It is therefore intended that the following appended claims and claims hereafter introduced in any national phase applications be interpreted to include all such modifications, permutations, additions and/or sub-combinations as are within their true spirit and scope.

REFERENCES

The following materials are incorporated by reference herein in their entirety and are referenced at appropriate sections in the foregoing text:

1. D. W. Jenkins and J. D. Dow, "Electronic properties of metastable $Ge_xSn_{1-x}$ alloys", Phys. Rev. B 36, 7994 (1987).

2. K. A. Mader, A. Baldereschi, and H. von Kanel, "Band structure and instability of $Ge_xSn_{1-x}$ alloys", Solid State Commun. 69, 1123 (1989).

3. R. A. Soref and L. Friedman, "Direct-gap Ge/GeSn/Si and GeSn/Ge/Si heterostructures", Superlattices and Microstructures 14, 189 (1993).

4. R. Soref, J. Menendez, J. Kouvetakis, "Strained engineered direct-gap $Ge/Sn_xGe_{1-x}$ heterodiode and multi-quantum well photodetectors, lasers, emitters, and modulators grown on $Sn_ySi_xGe_{1-y-z}$ buffered silicon", patent application 5. (a) P. R. Pukite, A. Harwit, and S. S. Iyer, Appl. Phys. Lett. 54, 2142 (1989). (b) G. He and H. A. Atwater, Phys. Rev. Lett. 79, 1937 (1997).

6. J. Taraci, J. Tolle, M. R. M. Cartney, J. Menendez, M. A. Santana, D. J. Smith, and J. Kouvetakis, Simple chemical routes to diamond-cubic germanium-tin alloys, Appl. Phys. Lett. 78, 3607 (2001).

7. Bauer, J. Taraci, J. Tolle, A. V. G. Chizmeshya, S. Zollner, D. J. Smith, J. Menendez, C. Hu, J. Kouvetakis, Ge—Sn semiconductors for band-gap and lattice engineering, Appl. Phys. Lett. 81, 2992-2994 (2002).

8. S. Taraci, S. Zollner, M. R. McCartney, J. Menéndez, M. A. Santana, D. J. Smith, A. Haaland, A. V. Tutukin, G. Gundersen, G. Wolf, and J. Kouvetakis, Synthesis of silicon-based infrared semiconductors in the Ge—Sn system using molecular chemistry methods, J. Am. Chem. Soc., 123 (44), 10980-10987, (2001).

9. A. V. G Chizmeshya, M. Bauer, and J. Kouvetakis, Experimental and theoretical study of deviations from Vegards Law in the $Ge_{1-x}Sn_x$ system, Chem. Mater. 15, 2511-251, 2003.

10. Shiu Fai Li, Matthew R. Bauer, José Menéndez, and John Kouvetakis, Scaling law for the compositional dependence of Raman frequencies in GeSi and SnGe alloys, Appl. Phys. Lett. 84, 867-869, (2004).

11. M. Bauer, A. V. G. Chizmeshya, J. Menendez, and J. Kouvetakis, Tunable band structure in diamond cubic tin germanium alloys grown on Si, Solid State Commun. 127, 355-359, (2003).

12. C. S. Cook, S. Zollner, J. Kouvetakis, J. Tolle, and J. Menendez, Optical constants and interband transitions of $Ge_{1-x}Sn_x$ alloys (x<0.2) grown on Si, in press Thin Solid Films (2003).

13. M. Bauer, C. S. Cook, S. Zollner, P. Crozier, A. Chizmeshya, and J. Kouvetakis, GeSn superstructured materials for Si-based optoelectronics Appl. Phys. Lett. 83, 3489, 2003.

14. M. Bauer, C. Ritter, P. Crozier, J. Menendez, J. Ren, and J. Kouvetakis, Synthesis of ternary Si—Ge—Sn semiconductors on Si(100) via $Sn_xGe_{1-x}$ buffer layers, Appl. Phys. Lett. 83 (9), 2163 (2003).

15. P. Aella, C. Cook, J. Tolle, S. Zollner, A. Chizmeshya and J. Kouvetakis, Structural and optical properties of $Sn_xSi_yGe_{1-x-y}$ alloys, Appl. Phys. Lett. 84, 888-890, (2004).

16. J. Menendez and J. Kouvetakis, Type-I $Ge/Ge_{1-x-y}Si_xSn_y$ strained-layer heterostructures with a direct Ge band gap, Appl. Phys. Lett. submitted 17. R. A. Soref and L. Friedman, Direct-gap Ge/GeSn/Si and GeSn/Ge/Si heterostructures, Superlattices and Microstructures 14, 189 (1993).

18. J. S. Park, R. P. G. Karunasiri, and K. L. Wang, "Observation olarge Stark shift in $Ge_xSi_{1-x}$/Si multiple quantum wells, J. Vac. Sci. Technol. B, vol. 8, pp. 217-220, 1990.

19. T. Baier, U. Mantz, K. Thonke, R. Sauer, F. Schäffler, and H.-J. Herzog, Type-II band alignment in Si/Si1_xGex quantum wells from photoluminescence line shifts due to optically induced band-bending effects: Experiment and theory, Phys. Rev. B, vol. 50, pp. 15191, 1994.

20. H. Temkin, T. P. Pearsall, J. C. Bean, A. Logan, and S. Luryi, $Ge_xSi_{1-x}$ strained-layer superlattice waveguide photodetectors operating near 1.3 m; Appl. Phys. Lett., vol. 48, pp. 963-965, 1986.

21. C. Li, Q. Yang, H. Wang, et al., J. Appl. Phys. 87, 8195 (2000).

22. Y. Miyake, J. Y. Kim, Y. Shiraki, and S. Fukatsu, Absence of Stark shift in strained $Si_{1-x}Ge_x$/Si Type-I quantum wells, Appl. Phys. Lett, vol. 68, pp. 2097-2099, 1996.

23. O. Qasaimeh, J. Singh, and P. Bhattacharya, IIEEE J. Quantum Electron. 33, 1532 (1997)

24. Jaros, Phys. Rev. B 37, 7112 (1988).

25. J. Tolle, R. Roucka, I. S. T. Tsong and J. Kouvetakis, Epitaxial growth of group III nitrides on Si substrates via a reflective lattice-matched zirconium diboride buffer layer, Appl. Phys. Lett. 82, 2398-2400, 2003.

26. C-H. Hu, A. V. G. Chizmeshya, J. Tolle, J. Kouvetakis and I. S. T. Tsong, Nucleation and growth of epitaxial $ZrB_2$ (0001) on Si(111) Journal of Crystal Growth in press (2004).

27. J. Tolle, D. Kim, S. Mahajan, A. Bell, F. A. Ponce, M. Kottke, J. Kouvetakis and I. S. T. Tsong, Epitaxial growth of AlGaN by metalorganic chemical vapor deposition on Si(111) via a $ZrB_2$(0001) buffer layer, Appl. Phys. Lett in press (2004).

What is claimed is:

1. A semiconductor structure comprising: a single quantum well $Ge_{1-x1-y}Si_{x1}Sn_y/Ge_{1-x2}Si_{x2}$ heterostructure grown strain-free on Si(100) via a $Sn_{1-x}Ge_x$ buffer layer.

2. The semiconductor structure of claim 1 wherein the heterostructure is deposited via chemical vapor deposition.

3. The semiconductor structure of claim 1, wherein x2 is between 0.02 and 0.2.

4. The semiconductor of claim 1, wherein 0.4<x1<0.6.

5. The semiconductor structure of claim 1, wherein x1 is between 0.4 and 0.6 and x2 is between 0.5 and 0.25.

* * * * *